(12) United States Patent
Choi

(10) Patent No.: US 12,062,255 B2
(45) Date of Patent: Aug. 13, 2024

(54) DIAGNOSIS INFORMATION GENERATING APPARATUS AND METHOD, AND DIAGNOSING SYSTEM INCLUDING THE SAME

(71) Applicant: LG ENERGY SOLUTION, LTD., Seoul (KR)

(72) Inventor: Ho-Deuk Choi, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 275 days.

(21) Appl. No.: 17/770,197

(22) PCT Filed: Jul. 2, 2021

(86) PCT No.: PCT/KR2021/008462
§ 371 (c)(1),
(2) Date: Apr. 19, 2022

(87) PCT Pub. No.: WO2022/010197
PCT Pub. Date: Jan. 13, 2022

(65) Prior Publication Data
US 2022/0392278 A1    Dec. 8, 2022

(30) Foreign Application Priority Data
Jul. 10, 2020 (KR) .......... 10-2020-0085462

(51) Int. Cl.
*G07C 5/08* (2006.01)
*G01R 31/382* (2019.01)
*G01R 31/396* (2019.01)

(52) U.S. Cl.
CPC ......... *G07C 5/0808* (2013.01); *G01R 31/382* (2019.01); *G01R 31/396* (2019.01)

(58) Field of Classification Search
CPC .. G07C 5/0808; G01R 31/382; G01R 31/396; G01R 31/3648; G01R 31/36;
(Continued)

(56) References Cited

U.S. PATENT DOCUMENTS

| 9,432,298 B1* | 8/2016 | Smith ................ H04L 49/9057 |
| 2005/0192727 A1* | 9/2005 | Shostak ................ G07C 5/008 |
| | | 701/1 |

(Continued)

FOREIGN PATENT DOCUMENTS

| JP | 2005-039328 A | 2/2005 |
| JP | 2009-286295 A | 12/2009 |

(Continued)

OTHER PUBLICATIONS

Extended European Search Report, dated Jun. 22, 2023, issued in corresponding EP Patent Application No. 21838652.3.

(Continued)

*Primary Examiner* — Richard M Camby
(74) *Attorney, Agent, or Firm* — Morgan, Lewis & Bockius LLP

(57) ABSTRACT

A diagnosis information generating apparatus according to an embodiment of the present disclosure includes: an input unit configured to receive diagnosis request information including data identification information for at least one of a plurality of diagnosis items of a diagnosis target and diagnosis data corresponding to the data identification information; a control unit configured to receive the diagnosis request information from the input unit, calculate a diagnosis data amount for the data identification information and the diagnosis data included in the diagnosis request information, select a packet structure corresponding to the calculated diagnosis data amount among a plurality of packet structures, and generate a communication packet including (Continued)

the diagnosis request information based on the selected packet structure; and a communication unit configured to output the communication packet generated by the control unit to an external diagnosing device as diagnosis information for the diagnosis target.

16 Claims, 7 Drawing Sheets

(58) Field of Classification Search
CPC . H04L 47/36; H04L 1/00; H04L 47/00; H04L 1/0007; H04L 1/0083; H04L 47/25; H04L 47/34
See application file for complete search history.

(56) References Cited

U.S. PATENT DOCUMENTS

| | | | |
|---|---|---|---|
| 2005/0273218 A1* | 12/2005 | Breed | G06K 7/10178 |
| | | | 701/2 |
| 2009/0299566 A1 | 12/2009 | Tanigawa et al. | |
| 2013/0139004 A1 | 5/2013 | Korogi et al. | |
| 2013/0179029 A1 | 7/2013 | Wang et al. | |
| 2014/0337680 A1 | 11/2014 | Hwang et al. | |
| 2016/0121816 A1 | 5/2016 | Koo | |
| 2017/0171051 A1 | 6/2017 | Joo | |
| 2018/0225341 A1* | 8/2018 | Merg | G06F 16/285 |
| 2021/0241549 A1* | 8/2021 | Jiang | H04L 69/324 |
| 2022/0392278 A1* | 12/2022 | Choi | G07C 5/0808 |
| 2023/0252824 A1* | 8/2023 | Merg | G07C 5/008 |
| | | | 701/29.4 |
| 2023/0282038 A1* | 9/2023 | Curtis | G07C 5/008 |

FOREIGN PATENT DOCUMENTS

| | | |
|---|---|---|
| JP | 2010-128730 A | 6/2010 |
| JP | 2013-113663 A | 6/2013 |
| JP | 2017-188793 A | 10/2017 |
| JP | 2018-146542 A | 9/2018 |
| KR | 10-1088798 B1 | 12/2011 |
| KR | 10-2014-0111009 A | 9/2014 |
| KR | 10-2014-0132063 A | 11/2014 |
| KR | 10-1573637 B1 | 12/2015 |
| KR | 10-1748272 B1 | 6/2017 |
| KR | 10-1846965 B1 | 4/2018 |
| KR | 10-2019-0046477 A | 5/2019 |
| KR | 10-2022986 B1 | 9/2019 |
| WO | 2013/085091 A1 | 6/2013 |
| WO | 2013/152826 A1 | 10/2013 |

OTHER PUBLICATIONS

Office Action dated Dec. 6, 2022, issued by the Japanese Patent Office in corresponding Japanese Patent Application No. 2022-510800.
International Search Report (with partial translation) and Written Opinion issued in corresponding International Patent Application No. PCT/KR2021/008462 on Oct. 20, 2021.

* cited by examiner

FIG. 4

| Byte | 1 | 2 | 3 | 4 | 5 | 6 | 7 | 8 |
|---|---|---|---|---|---|---|---|---|
| MESSAGE PACKET | PACKET SIZE | IDENTIFICATION INFORMATION | DATA IDENTIFICATION INFORMATION | | DIAGNOSIS DATA | | | |

FIG. 6

| Byte | 1 | 2 | 3 | 4 | 5 | 6 | 7 | 8 |
|---|---|---|---|---|---|---|---|---|
| MESSAGE PACKET | PACKET SIZE | | IDENTIFICATION INFORMATION | FIRST DATA IDENTIFICATION INFORMATION | | FIRST DIAGNOSIS DATA | | CLASSIFICATION INFORMATION |
| FIRST DATA PACKET | FIRST SEQUENCE INFORMATION | SECOND DATA IDENTIFICATION INFORMATION | | SECOND DIAGNOSIS DATA | | CLASSIFICATION INFORMATION | THIRD DATA IDENTIFICATION INFORMATION | |
| SECOND DATA PACKET | SECOND SEQUENCE INFORMATION | | THIRD DIAGNOSIS DATA | | CLASSIFICATION INFORMATION | FOURTH DATA IDENTIFICATION INFORMATION | | FOURTH DIAGNOSIS DATA |
| THIRD DATA PACKET | THIRD SEQUENCE INFORMATION | FOURTH DIAGNOSIS DATA | CLASSIFICATION INFORMATION | FIFTH DATA IDENTIFICATION INFORMATION | | FIFTH DIAGNOSIS DATA | | |

DIAGNOSIS INFORMATION GENERATING APPARATUS AND METHOD, AND DIAGNOSING SYSTEM INCLUDING THE SAME

TECHNICAL FIELD

The present application claims priority to Korean Patent Application No. 10-2020-0085462 filed on Jul. 10, 2020 in the Republic of Korea, the disclosures of which are incorporated herein by reference.

The present disclosure relates to a diagnosis information generating apparatus and method and a diagnosing system including the same, and more particularly, to a diagnosis information generating apparatus and method capable of effectively diagnosing a diagnosis target based on at least one diagnosis information and a diagnosing system including the same.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

Meanwhile, a device equipped with such a battery includes various ECUs (Electronic Control Units), and the ECUs communicate with each other to provide information or receive information from other ECUs. Taking a vehicle as an example, various functions and controls increase in the vehicle, and in particular, as an electric vehicle equipped with a battery is put to practical use, the amount of data transmission and reception between ECUs is increasing. Accordingly, communication standards and technologies for improving the efficiency of data communication between ECUs have been proposed.

For example, Patent Literature 1 discloses only a configuration in which a data receiving side changes a reception mode to a high speed mode or a normal mode using CAN (Controller Area Network) communication. However, Patent Literature 1 has a problem in that it is difficult to apply to a device such as an electric vehicle that needs to provide various information in real time because the traffic load is improved by changing the reception mode.

That is, in Patent Literature 1, the transmitting side must transmit single information through each communication packet. Therefore, when Patent Literature 1 is used, a problem may arise that it may take a considerable amount of time in a situation where diagnosis data must be quickly generated and transmitted and various ECU states must be diagnosed using the diagnosis data.

(Patent Literature 1) KR 10-1573637 B1

DISCLOSURE

Technical Problem

The present disclosure is designed to solve the problems of the related art, and therefore the present disclosure is directed to providing a diagnosis information generating apparatus and method capable of shortening a transmission time of a plurality of battery state information by flexibly selecting a communication channel according to the plurality of battery state information.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a diagnosis information generating apparatus, comprising: an input unit configured to receive diagnosis request information including data identification information for at least one of a plurality of diagnosis items of a diagnosis target and diagnosis data corresponding to the data identification information; a control unit configured to receive the diagnosis request information from the input unit, calculate a diagnosis data amount for the data identification information and the diagnosis data included in the diagnosis request information, select a packet structure corresponding to the calculated diagnosis data amount among a plurality of packet structures, and generate a communication packet including the diagnosis request information based on the selected packet structure; and a communication unit configured to output the communication packet generated by the control unit to an external diagnosing device as diagnosis information for the diagnosis target.

The control unit may be configured to calculate a packet size required for the communication packet based on the calculated diagnosis data amount, and select any one of a first packet structure including one message packet and a second packet structure including one message packet and at least one data packet based on the calculated packet size.

The message packet may be configured to include a packet size region having information about the packet size, an identification information region having identification information about the diagnosis request, and a diagnosis information region having the diagnosis request information.

The data packet may be configured to include a sequence information region having sequence information, and the diagnosis information region.

When the diagnosis request information received from the input unit includes a plurality of data identification information and a plurality of diagnosis data, the control unit may be configured such that at least one classification information for classifying the data identification information and the diagnosis data corresponding to each other is included in at least a part of the diagnosis information region of the message packet and the diagnosis information region of the data packet.

When the second packet structure is selected, the control unit may be configured to output the message packet first and then output the data packet through the communication unit.

When the data packet is generated in plurality, the control unit may be configured to output the plurality of generated data packets sequentially through the communication unit based on the sequence information.

The control unit may be configured to compare the calculated packet size with a preset reference value and select any one of the first packet structure and the second packet structure according to the comparison result.

The control unit may be configured to select the first packet structure when the calculated packet size is equal to or smaller than the preset reference value.

The control unit may be configured to select the second packet structure when the calculated packet size exceeds the preset reference value.

A diagnosis information generating method according to another aspect of the present disclosure may comprise: a diagnosis request information inputting step of receiving diagnosis request information including data identification information for at least one of a plurality of diagnosis items of a diagnosis target and diagnosis data corresponding to the data identification information; a diagnosis data amount calculating step of calculating a diagnosis data amount for the data identification information and the diagnosis data included in the diagnosis request information; a packet structure selecting step of selecting a packet structure corresponding to the calculated diagnosis data amount among a plurality of packet structures; a communication packet generating step of generating a communication packet including the diagnosis request information based on the selected packet structure; and a diagnosis information outputting step of outputting the communication packet to an external diagnosing device as diagnosis information for the diagnosis target.

A diagnosing system according to still another aspect of the present disclosure may comprise: the diagnosis information generating apparatus according to an aspect of the present disclosure; and a diagnosing device configured to receive the diagnosis information from the diagnosis information generating apparatus, extract the diagnosis request information from the received diagnosis information, determine at least one of a battery pack and an electronic control device as a diagnosis target according to the extracted diagnosis request information, diagnose a state of the diagnosis target according to the extracted diagnosis request information, and transmit the diagnosis result to the diagnosis information generating apparatus.

The diagnosing device may be configured to extract the data identification information and the diagnosis data from the diagnosis request information, apply a value of an item corresponding to the data identification information among the plurality of diagnosis items of the diagnosis target as the diagnosis data, and diagnose a state of the diagnosis target to which the diagnosis data is applied.

Advantageous Effects

According to one aspect of the present disclosure, there is an advantage in that diagnosis information may be effectively transmitted by generating a communication packet of a most suitable packet structure in consideration of the packet size of the communication packet.

The effects of the present disclosure are not limited to the effects mentioned above, and other effects not mentioned will be clearly understood by those skilled in the art from the description of the claims.

BRIEF DESCRIPTION OF DRAWINGS

The accompanying drawings illustrate preferred embodiments of the present disclosure and together with the foregoing disclosure, serve to provide further understanding of the technical features of the present disclosure, and thus, the present disclosure is not construed as being limited to the drawing.

FIG. 4 is a diagram schematically showing one embodiment of a communication packet generated by the diagnosis information generating apparatus according to an embodiment of the present disclosure.

FIG. 6 is a diagram schematically showing another embodiment of the communication packet generated by the diagnosis information generating apparatus according to an embodiment of the present disclosure.

EMBODIMENTS OF THE DISCLOSURE

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
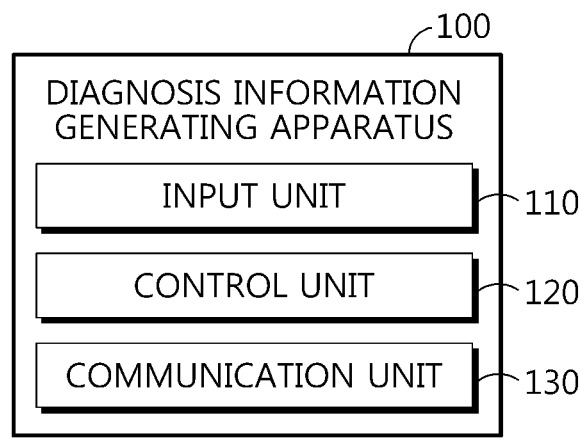
FIG. 1 is a diagram schematically showing a diagnosis information generating apparatus according to an embodiment of the present disclosure.

FIG. 1 is a diagram schematically showing a diagnosis information generating apparatus 100 according to an embodiment of the present disclosure.

Referring to FIG. 1, the diagnosis information generating apparatus 100 according to an embodiment of the present disclosure may include an input unit 110, a control unit 120, and a communication unit 130.

The input unit 110 may be configured to receive diagnosis request information including data identification information for at least one of a plurality of diagnosis items of a diagnosis target and diagnosis data corresponding to the data identification information.

Specifically, the input unit 110 may receive the diagnosis request information from the outside. For example, the input unit 110 may be connected to a personal computer (PC), a mobile, a touch screen, or other devices, and may receive information about data identification information and diagnosis data from these devices. In addition, the input unit 110 may be connected to an input device such as a keyboard, a mouse, and a touch pad, and may receive information about data identification information and diagnosis data from the input device.

Preferably, the data identification information may correspond to the plurality of diagnosis items of the diagnosis target. For example, the data identification information may correspond to items such as voltage, current, insulation resistance, or temperature of a battery pack. In addition, the data identification information may correspond to items such as link voltage of an electronic control unit (ECU) of an electric vehicle. In addition, the data identification information may correspond to various items that may be set for a battery pack and an electric vehicle.

Preferably, the diagnosis data may be a value corresponding to the data identification information. For example, when the data identification information is a voltage of a battery pack, the diagnosis data may be a voltage value for diagnosis.

The control unit 120 may be configured to receive the diagnosis request information from the input unit 110.

Specifically, the control unit 120 may be connected to communicate with the input unit 110. The control unit 120 and the input unit 110 may be connected by wire or wirelessly to enable data communication with each other. Accordingly, the control unit 120 may receive the diagnosis request information from the input unit 110.

Also, the control unit 120 may be configured to calculate a diagnosis data amount for the data identification information and the diagnosis data included in the diagnosis request information.

Specifically, the control unit 120 may calculate the diagnosis data amount for the diagnosis request information in units of bytes. The control unit 120 may calculate a byte size for the data identification information and calculate a byte size for the diagnosis data.

Preferably, since the data identification information is a value corresponding to the plurality of diagnosis items of the diagnosis target, it may have a fixed size. For example, the size of the data identification information may be 2 bytes.

Meanwhile, since the diagnosis data is a value for diagnosis corresponding to the data identification information, it may have various sizes depending on the input value. For example, when the diagnosis data is 2 [V], the size of the diagnosis data may be 1 byte. As another example, if the diagnosis data is 2.5 [V], the size of the diagnosis data may be 3 bytes.

In this way, the control unit 120 may calculate the size of the data identification information and the size of the diagnosis data, and calculate the total size of the diagnosis request information by summing the calculated values. That is, the control unit 120 may calculate the diagnosis data amount by summing the size of the data identification information and the size of the diagnosis data.

If the diagnosis request information includes a plurality of data identification information and a plurality of diagnosis data, the control unit 120 may calculate the sizes of all data identification information and all diagnosis data included in the diagnosis request information, and calculate a diagnosis data amount by summing the sizes.

For example, it is assumed that the diagnosis request information includes voltage and current of the battery pack as two data identification information, and includes 2 [V] and 5 [mA] as two diagnosis data. In this case, the control unit 120 may calculate the size of the two data identification information as 4 bytes by the formula of "2 Byte×2", and calculate the size of the two diagnosis data as 2 byes by the formula of "1 Byte×2". In addition, the control unit 120 may calculate the diagnosis data amount as 6 bytes by the formula of "4 Byte+2 Byte".

Also, the control unit 120 may be configured to select a packet structure corresponding to the calculated diagnosis data amount from among a plurality of packet structures, and generate a communication packet including the diagnosis request information based on the selected packet structure.

Specifically, the control unit 120 may select any one of the plurality of packet structures in consideration of the calculated diagnosis data amount. In addition, the control unit 120 may generate a communication packet including the diagnosis request information according to the selected packet structure. That is, the communication packet generated by the control unit 120 may include both at least one data identification information and at least one diagnosis data input by the input unit 110 from the outside.

The communication unit 130 may be configured to output the communication packet generated by the control unit 120 to an external diagnosing device as the diagnosis information for the diagnosis target.

Specifically, the communication unit 130 may be connected to the control unit 120. In addition, the control unit 120 may output the communication packet generated through the communication unit 130 to the diagnosing device. In this case, the communication packet output through the communication unit 130 may be diagnosis information for the diagnosing device. Thereafter, the diagnosing device may receive the diagnosis information from the communication unit 130 and perform a corresponding diagnosis based on the received diagnosis information.

The diagnosis information generating apparatus 100 according to an embodiment of the present disclosure may select a packet structure suitable for the size of the diagnosis request information among a plurality of packet structures, and generate diagnosis information through the selected packet structure. That is, the diagnosis information generating apparatus 100 may quickly and efficiently transmit the diagnosis request information to the external diagnosing device.

For example, referring to the ISO standard (ISO 14229) for the UDS (Unified Diagnostic Services) of a vehicle ECU, in the 0x2E service, one communication packet may include one data identification item (e.g., DID) and one diagnosis data (e.g., value for the DID) corresponding thereto. That is, according to the 0x2E service of ISO 14229, even when it is required to transmit a plurality of data identification items and a plurality of diagnosis data corresponding thereto, only one data identification item and only one diagnosis data may be included in one communication packet. Therefore, a considerable time delay may be caused while the diagnosis information generating apparatus 100 is transmitting a plurality of communication packets, respectively, and the diagnosing device is extracting data necessary for diagnosis from each of the plurality of received communication packets.

The diagnosis information generating apparatus 100 according to an embodiment of the present disclosure generates a communication packet based on a packet structure most suitable for the diagnosis data amount in order to solve problems that may be caused when using the 0x2E service of ISO 14229, and thus has an advantage of effectively transmitting diagnosis information to a diagnosing device.

Therefore, according to an embodiment of the present disclosure, a series of processes of transmitting diagnosis information, receiving the diagnosis information by the diagnosing device, and extracting information necessary for diagnosis from the diagnosis information received by the diagnosing device may be performed more quickly, thereby effectively saving the total time required for diagnosis on the diagnosis target.

Meanwhile, the control unit 120 provided to the diagnosis information generating apparatus 100 according to an embodiment of the present disclosure may selectively include processors known in the art, application-specific integrated circuit (ASIC), other chipsets, logic circuits, registers, communication modems, data processing devices, and the like to execute various control logic performed in the present disclosure. Also, when the control logic is implemented in software, the control unit 120 may be implemented as a set of program modules. At this time, the program module may be stored in a memory and executed by the control unit 120. The memory may be located inside or out of the control unit 120 and may be connected to the control unit 120 by various well-known means.

The control unit 120 may be configured to calculate a packet size required for the communication packet based on the calculated diagnosis data amount.

For example, the control unit 120 may calculate a total packet size of the communication packet including the diagnosis request information. Here, the communication packet may include not only the diagnosis request information, but also the packet identification information that must be included in the communication packet. That is, the control unit 120 may calculate the total packet size of the communication packets that may be generated including the diagnosis request information.

In addition, the control unit 120 may be configured to select any one of a first packet structure including one message packet and a second packet structure including one message packet and at least one data packet based on the calculated packet size.

Figure 2:
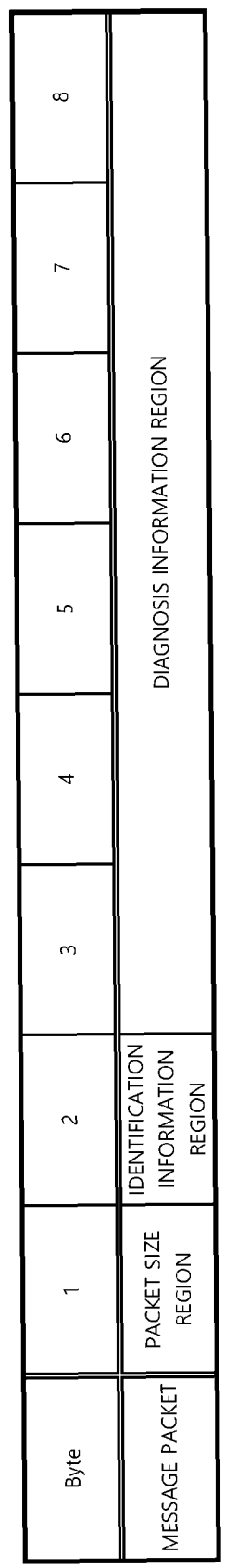
FIG. 2 is a diagram schematically showing an exemplary configuration of a message packet.

FIG. 2 is a diagram schematically showing an exemplary configuration of a message packet. Also, FIG. 3 is a diagram schematically showing another exemplary configuration of the message packet.

Figure 3:
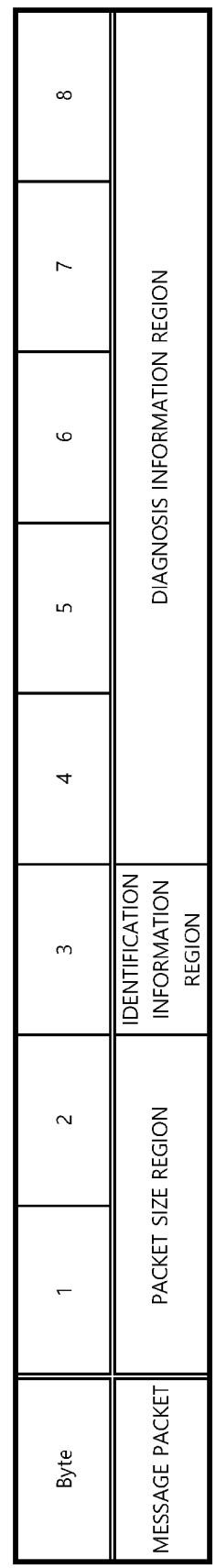
FIG. 3 is a diagram schematically showing another exemplary configuration of the message packet.

Referring to FIGS. 2 and 3, the message packet may be configured to include a packet size region including information about the packet size, an identification information region including identification information about a diagnosis request, and a diagnosis information region including the diagnosis request information.

Specifically, the packet size region may include a value for the packet size of the communication packet. Preferably, the packet size may be expressed in the units of bytes. For example, when the total packet size of the communication packet is 10 bytes, a value of 10 may be included in the packet size region. That is, the packet size region may include a data length code (DLC) for the communication packet.

In addition, referring to FIGS. 2 and 3, 1 byte or 2 bytes may be allocated to the packet size region according to the total packet size of the communication packet.

For example, a packet size region of a 1-byte size and a diagnosis information region of a 6-byte size may be allocated to the message packet according to FIG. 2. Meanwhile, a packet size region of a 2-byte size and a diagnosis information region of a 5-byte size may be allocated to the message packet according to FIG. 3.

The identification information region may include identification information to indicate that the corresponding communication packet is diagnosis information for the diagnosis target. For example, the identification information region may include a value for 0x2E to indicate that the diagnosis information to be transmitted is a 0x2E service according to the ISO 14229 standard.

In addition, the diagnosis information region may include the diagnosis request information. That is, the diagnosis information region may include the data identification item and the diagnosis data.

FIG. 4 is a diagram schematically showing one embodiment of a communication packet generated by the diagnosis information generating apparatus 100 according to an embodiment of the present disclosure.

Specifically, FIG. 4 is a diagram schematically showing a communication packet including a message packet in which 1 byte is allocated to the packet size region, 1 byte is allocated to the identification information region, and 6 bytes are allocated to the diagnosis information region. That is, the communication packet of the embodiment of FIG. 4 may correspond to the first packet structure including only the message packet.

In the embodiment of FIG. 4, a value for the packet size may be recorded in the packet size region. For example, the packet size recorded in the packet size region may be 7 bytes. In addition, a value for the identification information may be recorded in the identification information region. For example, the identification information recorded in the identification information region may be 0x2E. In addition, values for the data identification information and the diagnosis data may be recorded in the diagnosis information region.

Figure 5:
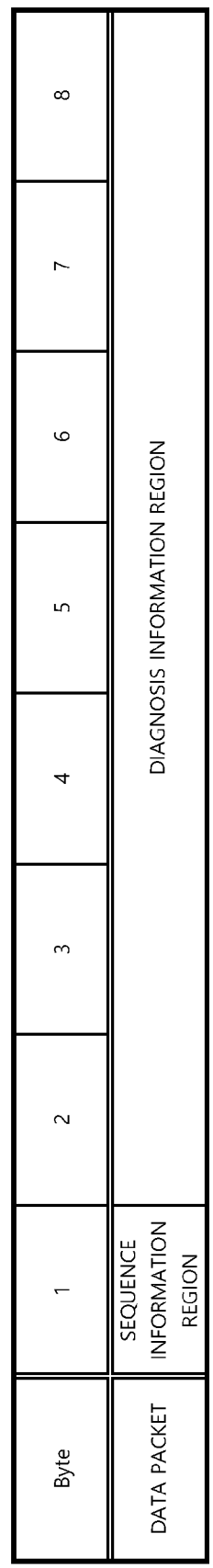
FIG. 5 is a diagram schematically showing an exemplary configuration of a data packet.

FIG. 5 is a diagram schematically showing an exemplary configuration of a data packet.

Referring to FIG. 5, the data packet may be configured to include a sequence information region including sequence information, and the diagnosis information region.

The sequence information region may include the sequence information for flow control of the data packet.

Referring to FIGS. 2 and 5, unlike the message packet, the data packet may include a sequence information region instead of the packet size region and the identification information region. That is, the data packet may be complementally generated when the diagnosis data amount exceeds a size that may be accommodated in one message packet. In addition, the sequence information region may include sequence information between one or more data packets.

For example, it is assumed that a communication packet including one message packet and two data packets is generated by the control unit 120. In this case, each of the two data packets may include sequence information among the three data packets.

Specifically, the control unit 120 may record the diagnosis request information in the message packet. If the diagnosis data amount of the diagnosis request information exceeds the size that the message packet may accommodate, the control unit 120 may record a part of the diagnosis request information in the diagnosis information region of the message packet. In addition, the control unit 120 may record the remaining diagnosis request information in the first data packet. Here, also, if the diagnosis data amount of the remaining diagnosis request information exceeds the size that the first data packet may accommodate, the control unit 120 may record a part of the remaining diagnosis request information in the diagnosis information region of the first data packet. Then, the control unit 120 may record the remaining diagnosis request information in the diagnosis information region of the second data packet.

That is, the plurality of data packets may have an order according to the order in which the diagnosis request information is recorded by the control unit 120. Therefore, the control unit 120 may allocate a sequence information region capable of recording such sequence information to the data packet so that the diagnosing device receiving the plurality of data packets may accurately extract the diagnosis request information from the plurality of packets according to the sequence information.

FIG. 6 is a diagram schematically showing another embodiment of the communication packet generated by the diagnosis information generating apparatus 100 according to an embodiment of the present disclosure.

Specifically, FIG. 6 is a diagram schematically showing a communication packet including a message packet in which 2 bytes are allocated to the packet size region, 1 byte is allocated to the identification information region, and 6 bytes are allocated to the diagnosis information region, and a plurality of data packets in which 1 byte is allocated to the sequence information region, and 7 bytes are allocated to the diagnosis information region. That is, the communication packet of the embodiment of FIG. 6 may correspond to the second packet structure including a message packet and at least one data packet.

In the embodiment of FIG. 6, the first data packet may include first sequence information, the second data packet may include second sequence information, and the third data packet may include third sequence information.

Even though FIG. 6 shows an embodiment in which three data packets are included in the communication packet generated by the control unit 120, it should be noted that the number of data packets that can be included in the communication packet may be decreased or increased according to the diagnosis data amount.

When the second packet structure is selected, the control unit 120 may be configured to first output the message packet through the communication unit 130 and then output the data packet.

In the embodiment of FIG. 6, the control unit 120 may select the second packet structure as a packet structure for generating a communication packet based on the diagnosis data amount of the diagnosis request information received from the input unit 110. In addition, the control unit 120 may generate a communication packet including one message packet and three data packets. Thereafter, the control unit 120 may first output the message packet through the communication unit 130 and then output three data packets.

For example, in the embodiment of FIG. 6, the packet size included in the packet size region of the message packet may be 32 bytes. In addition, the identification information included in the identification information region of the message packet may be 0x2E.

That is, since the packet size of the communication packet and the identification information of the communication packet may be included only in the message packet, the control unit 120 may first output the message packet and then output the data packet through the communication unit 130.

For example, in the embodiment of FIG. 6, it is assumed that the control unit 120 first outputs the plurality of data packets included in the communication packet through the communication unit 130 and then outputs the message packet. In this case, there is a problem that the diagnosing device cannot check whether the communication packet is completely received until it receives the message packet and checks the packet size and the identification information. That is, since the data packet includes only the sequence information, the data identification information and the diagnosis data, the diagnosing device cannot determine whether the communication packet is completely received at all until it checks the packet size and the identification information included in the message packet.

Accordingly, when the second packet structure is selected based on the diagnosis data amount of the diagnosis request information, the control unit 120 may output at least one data packet after outputting the message packet first through the communication unit 130.

Preferably, when the data packet is generated in plurality, the control unit 120 may be configured to sequentially output the plurality of generated data packets based on the sequence information through the communication unit 130.

Specifically, each of the plurality of data packets may include sequence information. Accordingly, even if the plurality of data packets are transmitted to the diagnosing device in a random order, the diagnosing device may perform flow control on the plurality of data packets by checking the sequence information included in each of the plurality of data packets.

However, when a plurality of data packets are generated, the control unit 120 may control the communication unit 130 to sequentially output the plurality of data packets according to the sequence information so that the diagnosis by the diagnosing device may be performed more quickly.

For example, in the embodiment of FIG. 6, the control unit 120 may generate a message packet, a first data packet, a second data packet, and a third data packet. In addition, the control unit 120 may first output the message packet to the diagnosing device using the communication unit 130. Thereafter, the control unit 120 may output the plurality of data packets in the order of the first data packet, the second data packet, and the third data packet to the diagnosing device using the communication unit 130.

When the diagnosis request information received from the input unit 110 includes a plurality of data identification information and a plurality of diagnosis data, the control unit 120 may be configured such that the diagnosis request information includes data identification information corresponding to at least a part of the diagnosis information region of the message packet and the diagnosis information region of the data packet, and at least one classification information for classifying the diagnosis data.

Specifically, the diagnosis request information received by the input unit 110 from the outside may include a plurality of data identification information and diagnosis data corresponding to each data identification information. That is, the diagnosis request information may include a plurality of pairs of data identification information and corresponding diagnosis data. Accordingly, the control unit 120 may record at least one classification information for classifying between the corresponding data identification information and diagnosis data in a part of the diagnosis information region of the message packet and/or the diagnosis information region of the data packet, which may be included in the diagnosis request information.

For example, in the embodiment of FIG. 6, the first data identification information may be recorded in the byte regions 4-5 of the message packet, and the first diagnosis data may be recorded in the byte regions 6-7 of the message packet. Here, the first diagnosis data may be data that may be expressed as 2 bytes. Thereafter, the byte region 8 of the message packet may include the classification information for classifying the first diagnosis data and second data identification information.

In addition, the first sequence information may be recorded in the byte region 1 of the first data packet, and the second data identification information may be recorded in the byte regions 2-3. That is, the first diagnosis data and the second data identification information may be classified based on the classification information recorded in the byte region 8 of the message packet. The second diagnosis data may be recorded in the byte regions 4-5 of the first data packet, and the classification information for classifying the second diagnosis data and third data identification information may be recorded in the byte region 6. In addition, the third data identification information may be recorded in the byte regions 7-8 of the first data packet.

In addition, the second sequence information may be recorded in the byte region 1 of the second data packet, and the third diagnosis data may be recorded in the byte regions 2-4. Here, the third diagnosis data may be a value that may be expressed as 3 bytes. The classification information for classifying the third diagnosis data and fourth data identification information may be recorded in the byte region 5 of the second data packet. In addition, the fourth data identification information may be recorded in the byte regions 6-7 of the second data packet, and a part of the fourth diagnosis data may be recorded in the byte region 8.

In addition, the third sequence information may be recorded in the byte region 1 of the third data packet, and a part of the fourth diagnosis data may be recorded in the byte region 2. The classification information for classifying the fourth diagnosis data and fifth data identification information may be recorded in the byte region 3 of the third data packet. In addition, the fifth data identification information may be recorded in the byte regions 4-5 of the third data packet, and the fifth diagnosis data may be recorded in the byte regions 6-8. Here, the fifth diagnosis data may be a value that may be expressed as 3 bytes.

If the classification information is not included in the message packet and/or the data packet, there is a problem that a part of the fourth diagnosis data recorded in the byte 8 of the second data packet and the remaining part of the fourth diagnosis data recorded in the byte region 2 of the third data packet may be erroneously recognized as independent and separate data by the diagnosing device.

Meanwhile, according to an embodiment of the present disclosure, the diagnosis information region of the message packet and/or the data packet may include classification information for classifying an $N^{th}$ diagnosis data and an $(N+1)^{th}$ data identification information. Accordingly, in the embodiment of FIG. 6, the diagnosing device may easily recognize the fourth diagnosis data recorded separately in the second data packet and the third data packet as one data.

Therefore, the diagnosis information generating apparatus 100 according to an embodiment of the present disclosure may prevent the diagnosing device from erroneously recognizing the diagnosis data in advance by recording the classification information in the message packet and/or the data packet. Due to this, the intended diagnosis process may be accurately carried out by the diagnosis request information received from the outside.

The control unit 120 may be configured to compare the calculated packet size with a preset reference value. In addition, the control unit 120 may be configured to select any one of the first packet structure and the second packet structure according to the comparison result.

Specifically, the control unit 120 may first calculate a diagnosis data amount for the diagnosis request information received from the input unit 110. In addition, the control unit 120 may calculate a total packet size of the communication packet based on the calculated diagnosis data amount.

For example, in the embodiments of FIGS. 4 and 6, the packet size included in the packet size region of the message packet may be 1 byte or 2 bytes according to the diagnosis data amount to be included in the communication packet. Therefore, the control unit 120 may first calculate the diagnosis data amount for the diagnosis request information, and then calculate the size of the communication packet including the diagnosis request information in consideration of the calculated diagnosis data amount.

In addition, the preset reference value may be a reference value for determining whether the diagnosis request information received by the input unit 110 from the outside can be transmitted through one message packet. For example, in the embodiment of FIGS. 4 and 6, the preset reference value may be 8 bytes.

Preferably, the control unit 120 may be configured to select the first packet structure when the calculated packet size is equal to or smaller than the preset reference value.

Specifically, if the total packet size of the communication packet calculated based on the diagnosis data amount of the diagnosis request information is smaller than or equal to the preset reference value, the control unit 120 may determine that the diagnosis request information can be recorded in one message packet. Accordingly, the control unit 120 may select the first packet structure and generate a communication packet according to the first packet structure.

For example, as in the embodiment of FIG. 4, the control unit 120 may record both the data identification information and the diagnosis data included in the diagnosis request information in one message packet.

Conversely, the control unit 120 may be configured to select the second packet structure when the calculated packet size exceeds the preset reference value.

Specifically, when the total packet size of the communication packet calculated based on the diagnosis data amount of the diagnosis request information exceeds the preset reference value, the control unit 120 may determine that the diagnosis request information cannot be recorded in one message packet. That is, the control unit 120 may determine that one message packet and at least one data packet are required to record all diagnosis request information. Accordingly, the control unit 120 may select the second packet structure and generate a communication packet according to the second packet structure.

For example, as in the embodiment of FIG. 6, the control unit 120 may record the first to fifth data identification information and the first to fifth diagnosis data included in the diagnosis request information in one message packet and three data packets.

Figure 7:
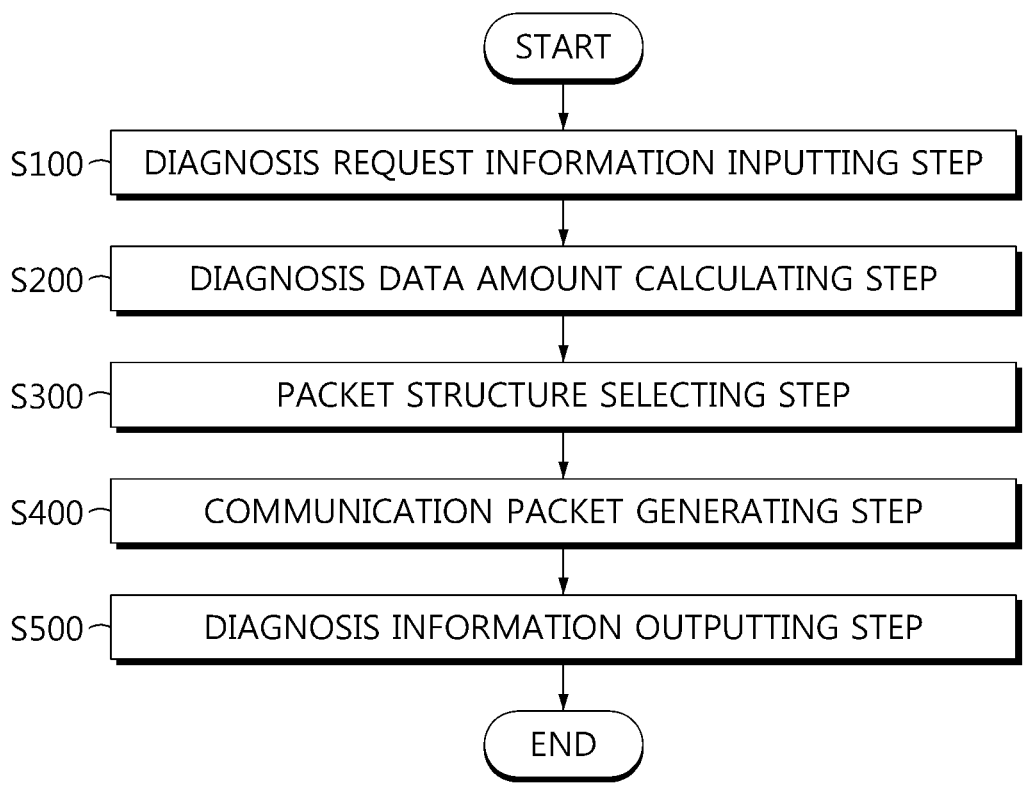
FIG. 7 is a diagram schematically showing a diagnosis information generating method according to another embodiment of the present disclosure.

FIG. 7 is a diagram schematically showing a diagnosis information generating method according to another embodiment of the present disclosure.

Preferably, each step of the diagnosis information generating method according to another embodiment of the present disclosure may be performed by the diagnosis information generating apparatus 100 according to an embodiment of the present disclosure. However, hereinafter, for convenience of explanation, content overlapping with the previously described content will be briefly described.

Referring to FIG. 7, the diagnosis information generating method may include a diagnosis request information inputting step, a diagnosis data amount calculating step, a packet structure selecting step, a communication packet generating step, and a diagnosis information outputting step.

The diagnosis request information inputting step is a step of receiving diagnosis request information including data identification information for at least one of a plurality of diagnosis items of a diagnosis target and diagnosis data corresponding to the data identification information, and may be performed by the input unit 110.

For example, the input unit 110 may receive diagnosis request information including data identification information and diagnosis data from the outside. In addition, the diagnosis request information may include a plurality of data identification information and a plurality of diagnosis data.

The diagnosis data amount calculating step is a step of calculating a diagnosis data amount for the data identification information and the diagnosis data included in the diagnosis request information, and may be performed by the control unit 120.

For example, the data identification information may be set to have a fixed size of 2 bytes. Meanwhile, the diagnosis data may be set to have a size of 1 byte or more. That is, the diagnosis data may have different sizes depending on the number of digits and decimal representation of the value.

If the control unit 120 calculates the diagnosis data amount only based on the number of the data identification information and the diagnosis data included in the diagnosis request information, the diagnosis data amount of the actual diagnosis request information and the calculated diagnosis data amount may be different. Therefore, the control unit 120 may calculate the diagnosis data amount for the diagnosis request information by directly considering the number of data identification information and the size of data for expressing the diagnosis data.

The packet structure selecting step is a step of selecting a packet structure corresponding to the calculated diagnosis data amount among a plurality of packet structures, and may be performed by the control unit 120.

Specifically, the control unit 120 may calculate the total packet size of the communication packet when the diagnosis request information is included based on the calculated diagnosis data amount. In addition, the control unit 120 may select any one of the first packet structure and the second packet structure according to the result of comparing the calculated packet size and a preset reference value.

The communication packet generating step is a step of generating a communication packet including the diagnosis request information according to the selected packet structure, and may be performed by the control unit 120.

For example, when the first packet structure is selected by the control unit 120, the control unit 120 may generate a communication packet including one message packet. Here, the message packet may include a packet size region, an identification information region, and a diagnosis information region.

As another example, when the second packet structure is selected by the control unit 120, the control unit 120 may generate a communication packet including one message packet and at least one data packet. Here, the data packet may include a sequence information region and a diagnosis information region.

The diagnosis information outputting step is a step of outputting the communication packet to an external diagnosing device as diagnosis information for the diagnosis target, and may be performed by the communication unit 130.

Specifically, the control unit 120 may control the communication unit 130 to output the generated communication packet to the diagnosing device.

The diagnosis information generating method according to another embodiment of the present disclosure has an advantage of effectively transmitting diagnosis information to a diagnosing device by using a packet structure most suitable for the size of the diagnosis information, namely the packet size of the communication packet.

Figure 8:
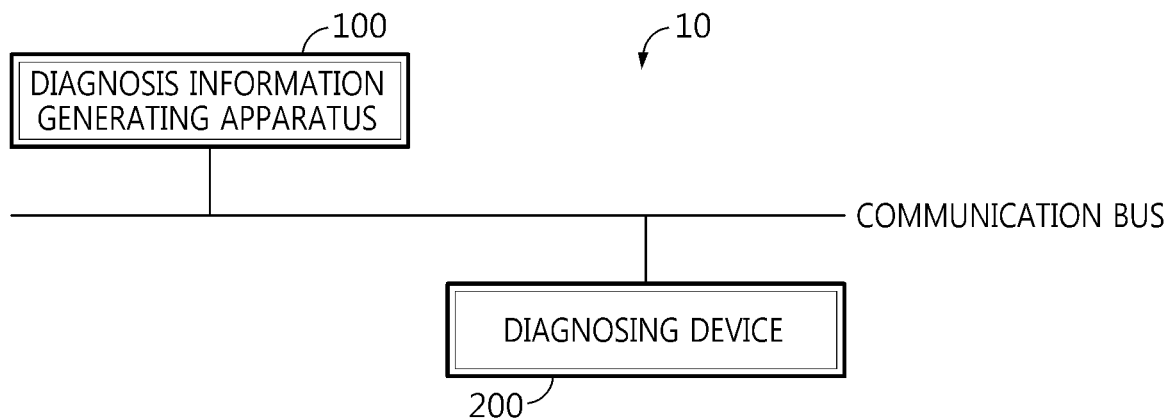
FIG. 8 is a diagram schematically showing a diagnosing system including the diagnosis information generating apparatus according to an embodiment of the present disclosure.

FIG. 8 is a diagram schematically showing a diagnosing system 10 including the diagnosis information generating apparatus 100 according to an embodiment of the present disclosure. Hereinafter, for convenience of description, it is noted that the content overlapping with the previously described content will be briefly described.

Referring to FIG. 8, the diagnosing system 10 may include the diagnosis information generating apparatus 100 and a diagnosing device 200.

The diagnosing device 200 may be configured to receive the diagnosis information from the diagnosis information generating apparatus 100.

Specifically, the diagnosis information generating apparatus 100 and the diagnosing device 200 may be connected to be communicable through a communication bus. Specifically, the diagnosis information generating apparatus 100 and the diagnosing device 200 may be connected to each other through a communication bus that allows CAN communication.

For example, in the embodiment of FIG. 8, the diagnosing device 200 may receive the diagnosis information from the diagnosis information generating apparatus 100. Specifically, the diagnosing device 200 may receive the diagnosis information output to the communication bus through the communication unit 130 of the diagnosis information generating apparatus 100.

The diagnosing device 200 may be configured to extract the diagnosis request information from the received diagnosis information.

Specifically, the diagnosing device 200 may first check the packet size included in the message packet from the received diagnosis information. If the packet size is equal to or smaller than the preset reference value, the diagnosing device 200 may extract only the diagnosis request information included in the message packet. If the packet size exceeds the preset reference value, the diagnosing device 200 may extract both the diagnosis request information included in the data packet as well as the message packet.

For example, when the diagnosis information corresponding to the communication packet according to the embodiment of FIG. 4 is transmitted to the diagnosing device 200, the diagnosing device 200 may extract the data identification information and the diagnosis data included in the diagnosis information region of the message packet. Specifically, the diagnosing device 200 may extract data identification information recorded in the byte regions 3-4 of the communication packet, and extract diagnosis data recorded in the byte regions 5-7 of the communication packet.

As another example, when the diagnosis information corresponding to the communication packet according to the embodiment of FIG. 6 is transmitted to the diagnosing device 200, the diagnosing device 200 may extract first data identification information and first diagnosis data included in the diagnosis information region of the message packet. In addition, the diagnosing device 200 may extract second data identification information, second diagnosis data, and third data identification information included in the diagnosis information region of the first data packet. Also, the diagnosing device 200 may extract third diagnosis data, fourth data identification information, and a part of fourth diagnosis data included in the diagnosis information region of the second data packet. Finally, the diagnosing device 200 may extract the remaining part of the fourth diagnosis data included in the diagnosis information region of the third data packet, fifth data identification information, and fifth diagnosis data.

In the process of extracting the plurality of data identification information and the plurality of diagnosis data included in the communication packet, the diagnosing device 200 may accurately classify an $N^{th}$ diagnosis data and an $(N+1)^{th}$ data identification information by using the classification information. For example, the diagnosing device 200 may construct fourth diagnosis data by merging a part of the fourth diagnosis data extracted from the diagnosis information region of the second data packet and the remaining part of the fourth diagnosis data extracted from the diagnosis information region of the third data packet.

The diagnosing device 200 may be configured to determine at least one of a battery pack and an electronic control device (ECU) as the diagnosis target according to the extracted diagnosis request information.

As described above, the data identification information included in the communication packet may correspond to the plurality of diagnosis items for the diagnosis target. Therefore, the diagnosing device 200 may accurately determine the diagnosis target whose state should be diagnosed based on the currently received diagnosis information based on the extracted data identification information.

For example, the diagnosis target may include a battery pack and an electronic control device. Here, the battery pack may be a cell assembly including at least one battery cell. Specifically, the battery cell means a physically separable one independent cell including a negative electrode terminal and a positive electrode terminal. For example, one pouch-type lithium polymer cell may be regarded as a battery cell. Also, the battery pack may include a battery module in which two or more battery cells are connected in series and/or in parallel.

In addition, the electronic control device includes an ACU (Airbag Control Unit), a BCM (Body Control Module), an ECU (Engine Control Unit), a PCM (Powertrain Control Module), a TCU (Transmission Control Unit), an ABS (Anti-lock Braking System), an ESC (Electronic Stability Control), a HPCU (Hybrid Power Control Unit), a BMS (Battery Management System), and a MCU (Motor Control Unit). However, since the diagnosing system 10 according to the present disclosure is not a system that can be limitedly applied only to electric vehicles, any electronic control device which includes configurable items and whose state can be diagnosed by the diagnosing device 200 may be selected as a diagnosis target by the diagnosing system 10 according to the present disclosure.

Also, the diagnosing device 200 may be configured to diagnose the state of the diagnosis target according to the extracted diagnosis request information.

Specifically, the diagnosing device 200 may be configured to extract the data identification information and the diagnosis data from the diagnosis request information.

In addition, the diagnosing device 200 may be configured to apply a value of an item corresponding to the data identification information among the plurality of diagnosis items of the diagnosis target as the diagnosis data.

That is, the diagnosing device 200 may convert the state of the diagnosis target into a state for diagnosis by applying the diagnosis data to the value of the item corresponding to the data identification information among the plurality of diagnosis items of the diagnosis target.

For example, if the diagnosis data corresponding to the data identification information is a defect value for the corresponding diagnosis item among the plurality of diagnosis items of the diagnosis target, the diagnosing device 200 may forcibly generate a defect for the diagnosis target based on the extracted diagnosis data. That is, the diagnosing device 200 may temporarily change the state of the diagnosis target to a defective state.

As another example, when the diagnosis data corresponding to the data identification information is a value for simple simulation, the diagnosing device 200 may temporarily convert the state of the diagnosis target to a state for simulation based on the extracted diagnosis data.

In addition, the diagnosing device 200 may be configured to diagnose the state of the diagnosis target to which the diagnosis data is applied. Specifically, the diagnosing device 200 may diagnose the state of the temporarily switched diagnosis target according to the diagnosis information.

Finally, the diagnosing device 200 may be configured to transmit the diagnosis result to the diagnosis information generating apparatus 100.

Specifically, the diagnosing device 200 may diagnose the state of the diagnosis target based on the diagnosis information received from the diagnosis information generating apparatus 100, and transmit the diagnosis result to the diagnosis information generating apparatus 100.

For example, the diagnosis result transmitted by the diagnosing device 200 to the diagnosis information generating apparatus 100 may include a first diagnosis result indicating that no defect is found or a second diagnosis result indicating that a defect is found.

The diagnosis information generating apparatus 100 may receive the diagnosis result from the diagnosing device 200 and provide the received diagnosis result to a user, thereby terminating the diagnosis of the diagnosis target based on the diagnosis request information received through the input unit 110.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

10: diagnosing system
100: diagnosis information generating apparatus
110: input unit
120: control unit
130: communication unit
200: diagnosing device

What is claimed is:

1. A diagnosis information generating apparatus, comprising:
an input circuit configured to receive diagnosis request information including data identification information for at least one of a plurality of diagnosis items of a diagnosis target and diagnosis data corresponding to the data identification information;
a control circuit configured to receive the diagnosis request information from the input circuit, to calculate a diagnosis data amount for the data identification information and the diagnosis data included in the diagnosis request information, to select a packet structure corresponding to the calculated diagnosis data amount among a plurality of packet structures, and to generate a communication packet including the diagnosis request information based on the selected packet structure; and
a communication circuit configured to output the communication packet generated by the control circuit to an external diagnosing device as diagnosis information for the diagnosis target,
wherein the control circuit is further configured to calculate a packet size for the communication packet based on the calculated diagnosis data amount and to select any one of a first packet structure including one message packet and a second packet structure including one message packet and at least one data packet based on the calculated packet size.

2. The diagnosis information generating apparatus according to claim 1,
wherein the message packet is configured to include a packet size region having information about the packet size, an identification information region having identification information about the diagnosis request, and a diagnosis information region having the diagnosis request information, and
wherein the at least one data packet is configured to include a sequence information region having sequence information, and the diagnosis information region.

3. The diagnosis information generating apparatus according to claim 2,
wherein if the diagnosis request information received from the input circuit includes a plurality of data identification information and a plurality of diagnosis data, the control circuit is further configured such that at least one classification information for classifying the data identification information and the diagnosis data corresponding to each other is included in at least a part of the diagnosis information region of the message packet and the diagnosis information region of the at least one data packet.

4. The diagnosis information generating apparatus according to claim 2,
wherein if the second packet structure is selected, the control circuit is further configured to output the message packet first and then output the at least one data packet through the communication circuit.

5. The diagnosis information generating apparatus according to claim 4,
wherein if the at least one data packet is generated in a plurality of data packets, the control circuit is further configured to output the plurality of generated data packets sequentially through the communication unit based on the sequence information.

6. The diagnosis information generating apparatus according to claim 1,
wherein the control circuit is further configured to compare the calculated packet size with a preset reference value and to select any one of the first packet structure and the second packet structure according to the comparison result.

7. The diagnosis information generating apparatus according to claim 6, wherein the control circuit is further configured to:
select the first packet structure if the calculated packet size is equal to or smaller than the preset reference value, and
select the second packet structure if the calculated packet size exceeds the preset reference value.

8. A diagnosis information generating method, comprising:
receiving diagnosis request information including data identification information for at least one of a plurality of diagnosis items of a diagnosis target and diagnosis data corresponding to the data identification information;
calculating a diagnosis data amount for the data identification information and the diagnosis data included in the diagnosis request information;
calculating a packet size for a communication packet including the diagnosis request information based on the calculated diagnosis data amount;
selecting, based on the calculated packet size, a packet structure corresponding to the calculated diagnosis data amount among a first packet structure including one message packet and a second packet structure including one message packet and at least one data packet;
generating the communication packet including the diagnosis request information based on the selected packet structure; and
outputting the communication packet to an external diagnosing device as diagnosis information for the diagnosis target.

9. A diagnosing system, comprising:
a diagnosis information generating apparatus according to claim 1; and
a diagnosing device configured to receive the diagnosis information from the diagnosis information generating apparatus, to extract the diagnosis request information from the received diagnosis information, to determine at least one of a battery pack and an electronic control device as a diagnosis target according to the extracted diagnosis request information, to diagnose a state of the diagnosis target according to the extracted diagnosis request information, and to transmit the diagnosis result to the diagnosis information generating apparatus.

10. The diagnosing system according to claim 9, wherein the diagnosing device is further configured to extract the data identification information and the diagnosis data from the diagnosis request information, to apply a value of an item corresponding to the data identification information among the plurality of diagnosis items of the diagnosis target as the diagnosis data, and to diagnose a state of the diagnosis target to which the diagnosis data is applied.

11. The diagnosing system according to claim 9, wherein the message packet is configured to include a packet size region having information about the packet size, an identification information region having identification information about the diagnosis request, and a diagnosis information region having the diagnosis request information, and
wherein the at least one data packet is configured to include a sequence information region having sequence information, and the diagnosis information region.

12. The diagnosing system according to claim 11, wherein if the diagnosis request information received from the input circuit includes a plurality of data identification information and a plurality of diagnosis data, the control circuit is further configured such that at least one classification information for classifying the data identification information and the diagnosis data corresponding to each other is included in at least a part of the diagnosis information region of the message packet and the diagnosis information region of the at least one data packet.

13. The diagnosing system according to claim 11, wherein if the second packet structure is selected, the control circuit is further configured to output the message packet first and then output the at least one data packet through the communication circuit.

14. The diagnosing system according to claim 13, wherein if the at least one data packet is generated in a plurality of data packets, the control circuit is further configured to output the plurality of generated data packets sequentially through the communication unit based on the sequence information.

15. The diagnosing system according to claim 9, wherein the control circuit is further configured to compare the calculated packet size with a preset reference value and to select any one of the first packet structure and the second packet structure according to the comparison result.

16. The diagnosing system according to claim 15, wherein the control circuit is further configured to:
select the first packet structure if the calculated packet size is equal to or smaller than the preset reference value, and
select the second packet structure if the calculated packet size exceeds the preset reference value.

* * * * *